United States Patent [19]
Ueda et al.

[11] Patent Number: 5,701,033
[45] Date of Patent: Dec. 23, 1997

[54] SEMICONDUCTOR DEVICE

[75] Inventors: Tetsuya Ueda; Jun Shibata; Yomiyuki Yama, all of Tokyo, Japan

[73] Assignee: Mitsubishi Denki Kabushiki Kaisha, Tokyo, Japan

[21] Appl. No.: 593,965

[22] Filed: Jan. 30, 1996

[30] Foreign Application Priority Data

Mar. 20, 1995 [JP] Japan ............................ 7-060434

[51] Int. Cl.$^6$ .......................... H01L 23/12; H01L 23/28; H01L 23/34; H01L 23/02
[52] U.S. Cl. .......................... 257/704; 257/723; 257/724; 257/787; 257/924
[58] Field of Search .......................... 257/704, 684, 257/687, 705, 706, 707, 787, 788, 789, 795, 675, 723, 724, 924, 713

[56] References Cited

U.S. PATENT DOCUMENTS 5,091,772  2/1992  Kohara et al. .................... 357/74

FOREIGN PATENT DOCUMENTS

| 59-175131 | 10/1984 | Japan | 257/701 |
|---|---|---|---|
| 62-245663 | 10/1987 | Japan | 257/691 |
| 63-260059 | 10/1988 | Japan | 257/723 |
| 6453568 | 3/1989 | Japan . | |
| 1114061 | 5/1989 | Japan . | |
| 3225859 | 10/1991 | Japan . | |
| 5-343607 | 12/1993 | Japan | 257/723 |

*Primary Examiner*—Mahshid D. Saadat
*Assistant Examiner*—Jhihan B. Clark
*Attorney, Agent, or Firm*—Leydig, Voit & Mayer, Ltd

[57] ABSTRACT

A semiconductor device comprising a substrate having a hollow cavity for mounting a semiconductor element therein and a lowered step surface at a periphery of the cavity for mounting a chip component thereon. A semiconductor element is mounted within the cavity and a chip capacitor is mounted to the lowered step surface. The semiconductor element and the chip component are adapted to be connected to an external circuit through electrical conductors. A cap is attached to the substrate and a seal material is filled into a space defined between the cap and the substrate for sealing the cavity and for encapsulating the chip component on the lowered step surface which may extend along the entire periphery of the cavity. The cap may include a projection adapted to abut gainst a side wall of the lowered step surface, or alternatively, the lowered step surface may include a side wall having a projection adapted to abut against periphery of the cap. The semiconductor device may further comprise a heat sink attached to the semiconductor element.

14 Claims, 5 Drawing Sheets

SEMICONDUCTOR DEVICE

BACKGROUND OF THE INVENTION

This invention relates to a semiconductor device and, more particularly, to a semiconductor device having a hollow semiconductor package in which a semiconductor chip is cap-sealed within a hollow cavity of the multi-layered wiring substrate.

FIG. 9 is a partially sectioned perspective view illustrating a conventional semiconductor package and FIG. 10 is a cross sectional view of the semiconductor package shown in FIG. 9. In these figures, the reference numeral 1 is a semiconductor chip, 2 are wires made of aluminum or gold, 3 is a multi layer wiring substrate made of FR4, BT resin or the like, 4 are solder balls made of lead and tin, 5 is a cap made of BT resin, a ceramic or the like, 6 is a sealing resin for sealing the cap 5, 7 is a metal plate made of copper, a copper alloy or the like, 8a is a small capacity chip capacitor made of ceramic, 8b is a large capacity chip capacitor and 9 is a heat dissipating fin made of aluminum, copper or the like.

In the conventional hollow type semiconductor package, the plurality of solder balls 4 are disposed in an array on the surface of the multi layer wiring substrate 3, the semiconductor chip 1 as well as the wires 2 electrically connecting the semiconductor chip 1 and the multi layer wiring substrate 3 are accommodated within the hollow cavity at the center of the multi layer wiring substrate 3, and further the semiconductor chip 1 and the wires 2, etc. are sealed by the cap 5. On the other hand, the central portion of the surface of the multi layer wiring substrate 3 has formed thereon the metal plate 7 made of copper, a copper alloy or the like for dissipating heat generated from the semiconductor chip 1, and the metal plate 7 has attached thereto the heat dissipating fin 9 made of aluminum, copper or the like.

The chip capacitors 8a and 8b discussed above are necessary for eliminating noise, for example, for ensuring high speed of the semiconductor chip, exceeding 50 MHz, for example. In the conventional semiconductor device, such chip capacitors 8a and 8b are mounted on the surface of the above-mentioned multi layer wiring substrate 3 as shown in FIG. 10.

However, as illustrated in FIG. 10, for example, when a small capacity chip capacitor 8a is to be mounted on the surface of the multi layer wiring substrate 3, the heat dissipating fin 9 must be mounted on the chip capacitor 8a, disadvantageously resulting in a large thickness of the semiconductor device as a whole. Also, when the large capacity chip capacitor 8b is to be mounted on the surface of the multi layer wiring substrate 3, the heat dissipating fin 9 must be mounted not to interfere with the large capacity chip capacitor 8b, so that the heat dissipating fin 9 must be made small-sized, disadvantageously posing a problem of ineffective and insufficient heat dissipation from the semiconductor chip 1. Further, as shown in FIG. 10, when the large capacity chip capacitor 8b is mounted to the surface of the multi layer wiring substrate 3, the chip capacitor 8b may be dislodged from multi layer wiring substrate 3 due to the adverse external environmental conditions.

SUMMARY OF THE INVENTION

Accordingly, the main object of the present invention is to provide a semiconductor device free from the above-discussed disadvantages of the conventional device.

Another object of the present invention is to provide a thin semiconductor device even with a chip component such as a chip capacitor mounted thereon.

Another object of the present invention is to provide a semiconductor device in which a large size heat dissipating fin can be used even when a chip component such as a chip capacitor is mounted.

Still another object of the present invention is to provide a semiconductor device in which there is no fear that a chip component such as a chip capacitor will be dislodged from the substrate.

With the above objects in view, the present invention resides in a semiconductor device comprising a substrate having a hollow cavity for mounting a semiconductor element therein and a lowered step surface at a periphery of the cavity for mounting a chip component thereon. The semiconductor device also comprises a semiconductor element mounted within the cavity, a chip component mounted to the lowered step surface and cooperable with the semiconductor element. Electrical connecting means such as inner leads are disposed in the substrate for electrically connecting the semiconductor element within the cavity and the chip component on the step surface to an external circuit. Sealing means is attached to the substrate for sealing the semiconductor element within the cavity and the chip component on the lowered step surface.

The sealing means may comprise a cap attached to the substrate and a seal material filling a space defined between the cap and the substrate for sealing the cavity and for encapsulating the chip component on the lowered step surface which may extend along the entire periphery of the cavity. The cap may include a projection abutting against a side wall of the lowered step surface, or alternatively, the lowered step surface may include a side wall having a projection abutting against periphery of the cap. The semiconductor device may further comprise a heat sink attached to the semiconductor element.

Further, the cap may have a notch formed therein, and the lowered step surface for mounting the chip component thereon in the hollow cavity of the substrate, positioned opposite to a plane of the notch of the cap.

Alternatively, the substrate may have formed therein a recess for mounting the chip component positioned not opposite a plane of the cap.

Further, the substrate may have formed therein a recess for mounting the chip component at a position within the hollow cavity of the substrate opposite to the plane of the cap.

In the semiconductor device of the present invention, the chip component may be a chip capacitor.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
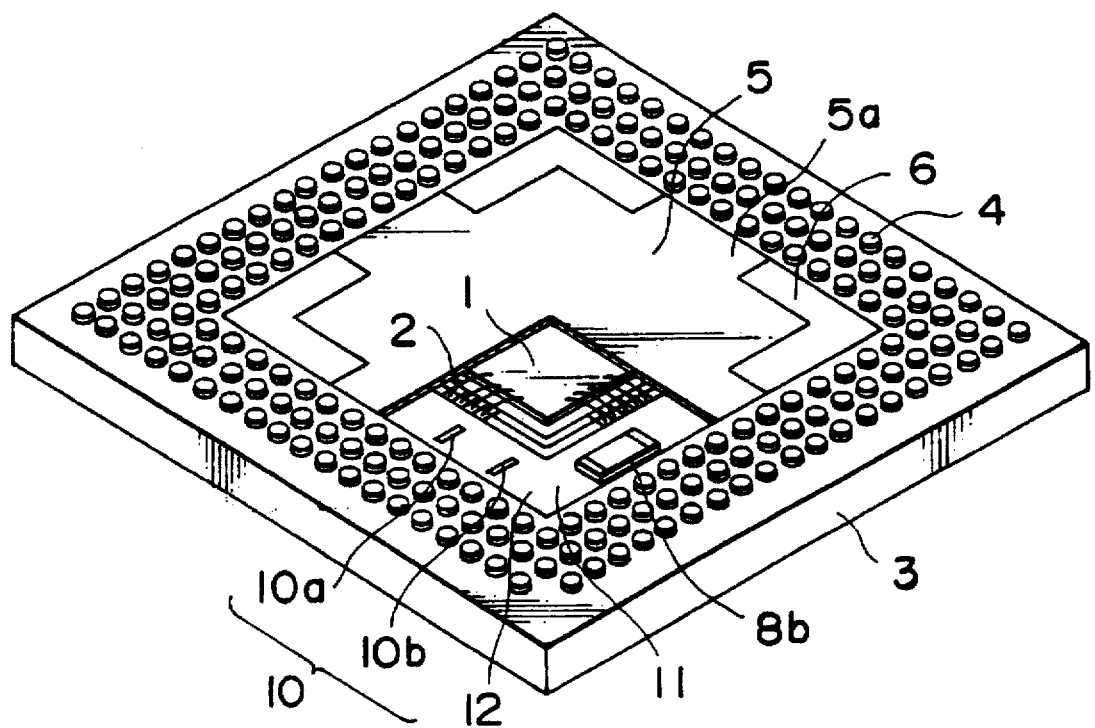
FIG. 1 is a partially sectioned, perspective view of a semiconductor device of a first embodiment of the present invention.
Figure 2:
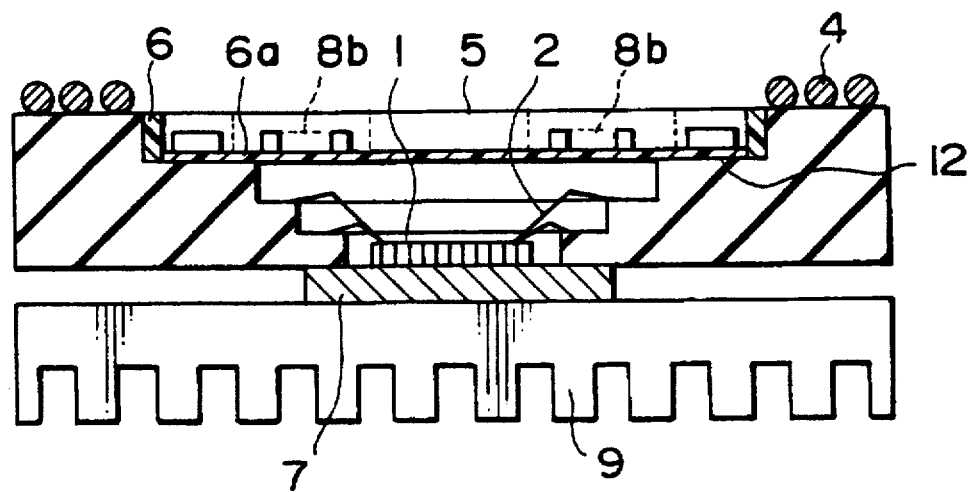
FIG. 2 is a sectional view of the semiconductor device of the first embodiment of the present invention.

FIG. 1 is a partially sectioned, perspective view of a semiconductor device of a first embodiment of the present invention, and FIG. 2 is a sectional view of the semiconductor device of the first embodiment. In these figures, reference numeral 1 is a semiconductor chip, 2 are wires made of aluminum or gold, 3 is a multilayer wiring substrate made, for example, of FR4 or BT resin, 4 are solder balls made of lead and tin, 5 is a cap made of BT resin or a ceramic, for example, 5a is a projecting portion of the cap, 6 is a sealing resin encapsulating the cap 5 and the chip capacitor, 6a is a cap resin applied to the bottom surface of the cap 5, 7 is a metal plate made of copper, copper alloy or the like, 8b is a large capacitance chip capacitor made of a ceramic and 9 is heat sink or heat dissipating fins made of aluminum, copper or the like. Also in the figure, the reference numerals 10 are lands made of an electrical conductor such as gold, copper or the like, which are composed of electrical source layers 10a inside of the multilayer wiring substrate 3 and the lead wire of the ground layers 10b. These lands 10 are disposed on the lowered step surface 12 which is a surface of the substrate 3 located at a position lower than the top surface of the substrate 3 by a distance corresponding to the difference between of the thickness of the substrate 3 and the bonding agent 6a below the cap 5. Also in the figure, the reference numeral 11 is a sealing portion for covering the multilayer wiring substrate 3 and the cap 5 with the sealing resin 6.

In this embodiment, the portion of the outer periphery of the cap 5, which does not have the projecting portion 5a corresponds to the "notch" portion of the cap 5 in the present invention. Also, the sealing portion 11 in which the above-mentioned sealing resin 6 is located, is opposite the thickness of the substrate 3 at the "notch" portion of the cap 5. That is, in this embodiment, the cap 5 is formed by eliminating the portion of the cap 5 at the region for mounting the chip capacitors 8b therein so that the eliminated portions define "notches". Also, the other portions at the regions for mounting the chip capacitors 8b define projecting portions 5a which are not notched. These projecting portions 5a are used in precisely positioning the cap 5 relative to the hollow cavity of the substrate 3 by bringing them into abutment against the side wall surfaces of the hollow cavity of the substrate when the cap 5 is attached.

Also in this embodiment, the sealing portion 11 on the lowered step surface 12 to which the chip capacitors 8b are mounted is provided with lands 10 which are conductors extending from the interior of the multilayer wiring substrate 3. Upon sealing the cap 5 to the sealing portion 11, the chip capacitors 8b are bonded to the land 10 on the lowered step surface 12 with an electrically conductive bonding agent (not shown) and then the cap 5 is sealed by the cap resin 6a, and thereafter the chip capacitors 8b are encapsulated with the sealing resin 6. In this embodiment, before the cap 5 is encapsulated by the sealing resin 6, the cap 5 is sealed with the cap resin 6a and then the chip capacitors 8b are encapsulated by the sealing resin 6. However, the chip capacitors 8b may be bonded with the conductive bonding agent (not shown) to the lands 10 without using the cap resin 6a, and then the cap 5 as well as the chip capacitors 8b may be encapsulated by the sealing resin 6.

As described above, according to this embodiment, a plurality of large capacitance chip capacitors 8b are provided on the cap 5 side of the substrate 3, so that a semiconductor chip 1 can be made to have a sufficient speed, i.e., an operating frequency higher than 50 MHz, for example, and yet the overall dimensions of the multi layer wiring substrate 3 of the semiconductor package does not become large. Also, since the cap 5 is provided with projecting portions 5a, the positioning of the cap 5 relative to the substrate 3 is easy, preventing dislocation of the cap 5. Further, since the chip capacitors 8b are completely covered with the sealing resin 6, they are protected against falling off due to the external environment, increasing reliability. Further, a large heat dissipating fin 9 that has a good heat dissipating efficiency may be used because no chip components which interfere with other components is provided on the surface of the multi layer wiring substrate 3.

While a semiconductor device in which chip capacitors are formed within the substrate has been proposed as disclosed in Japanese Patent Laid-Open No. 3-225859, such a device is high in manufacturing cost due to the increased number of the substrate manufacturing steps. Contrary to the conventional semiconductor device, the present invention has as its object the provision of a substrate allowing operation at a high frequency at a manufacturing cost similar to that of the conventional substrate.

Figure 3:
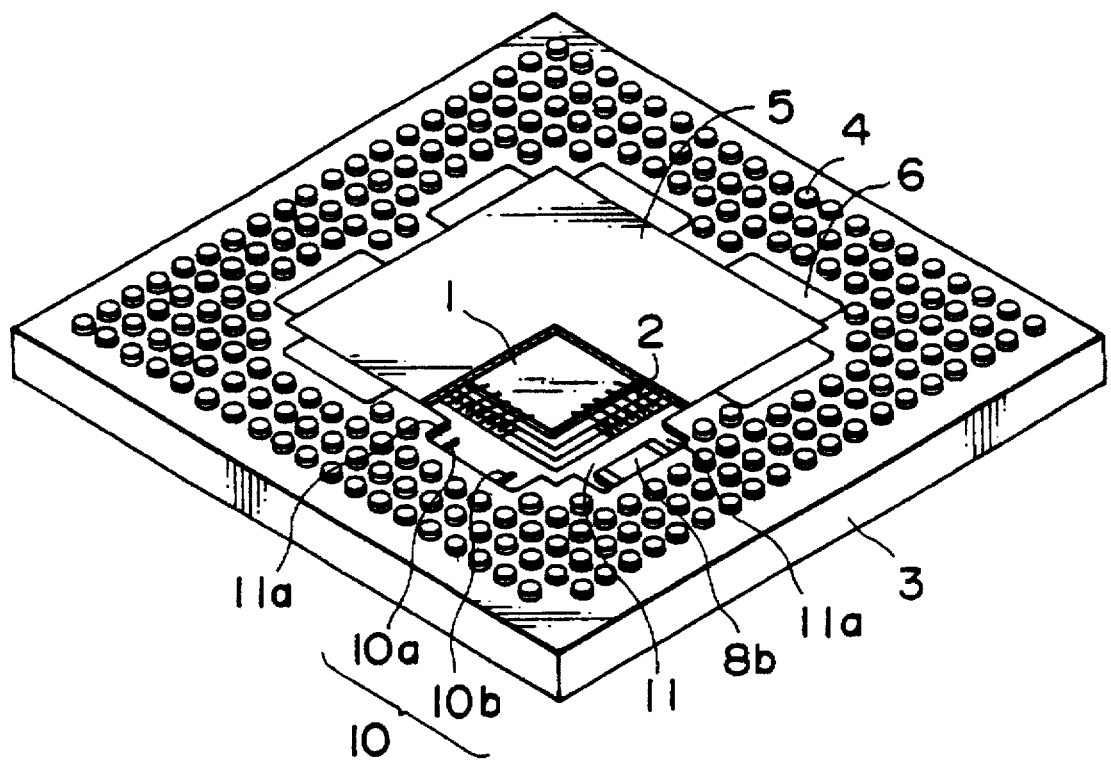
FIG. 3 is a partially sectioned, perspective view of a semiconductor device of a second embodiment of the present invention.
Figure 4:
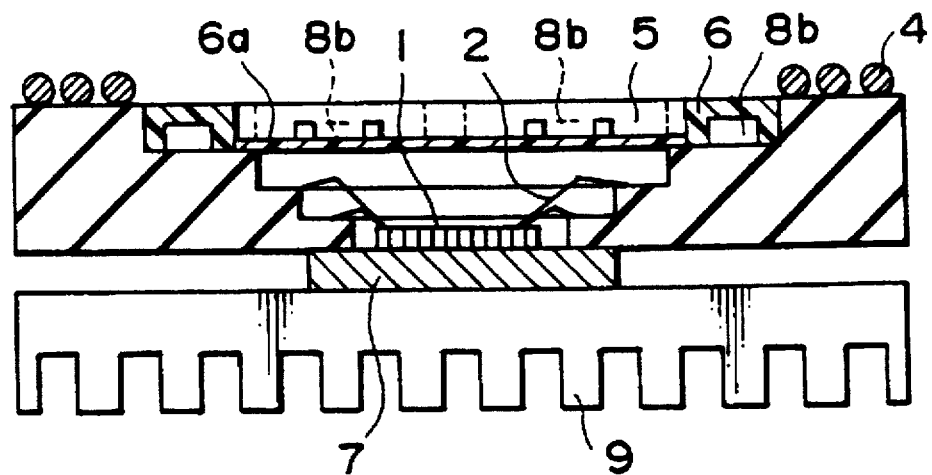
FIG. 4 is a sectional view of the semiconductor device of the second embodiment of the present invention.

FIG. 3 is a partially sectioned, perspective view illustrating a semiconductor device of a second embodiment of the present invention and FIG. 4 is a sectional view of the semiconductor device shown in FIG. 3. In these figures, the reference numeral 1 is a semiconductor chip, 2 are bonding wires made of aluminum or gold, 3 is a multilayer wiring substrate made of FR4 or BT resin or the like, 4 are solder balls made of lead and tin, 5 is a cap made of BT resin or a ceramic, 6 is a sealing resin encapsulating the cap 5 and the chip capacitors 8b, 6a is a cap resin for sealing the cap 5, 7 is a metal plate made of copper or copper alloy, 8b are large capacitance chip capacitors made of a ceramic, 9 is a heat sink or a heat dissipating fin made of aluminum, copper or the like, 11 is a sealing portion of the lowered step surface 12 in which the multilayer wiring substrate 3 and the cap 5 are covered with the sealing resin 6, and 11a are recesses or counter-sinks formed in the sealing portion 11. In this embodiment, the sealing portion 11 is the portion which does not oppose the plane of the cap 5. In this embodiment, lands 10 made of a conductor such as gold, copper or the like are formed within the recesses 11a of the sealing portion 11 by extending lead wires of the source layer 10a and the ground layer 10b inside of the multilayer wiring substrate 3.

When the cap 5 is to be sealed to the sealing portion 11 in this embodiment, the chip capacitors 8b are first bonded to the lands 10 with a conductive bonding agent (not shown) and then the cap 5 and the plurality of chip capacitors 8b are covered with the sealing resin 6.

According to this embodiment, as has been described, the sealing portion 11 is provided with the recesses 11a and the large capacitance chip capacitors 8b are mounted to the lands 10 within these recesses 11a. Therefore, a high speed operation higher than an operating frequency of 50 MHz can be maintained as in the first embodiment, and the outer configuration of the multilayer wiring substrate 3 of the semiconductor package does not become large. Also, since the shape of the cap 5 may be the same as that of the conventional design, the manufacturing cost is not increased. Further, since the chip capacitors 8b are completely covered by the sealing resin 6, they are protected against falling off the substrate 3 due to an external force or environment.

While the lands 10 to which the chip capacitors 8b are mounted are disposed within the recesses 11a of the sealing portion 11 and these recesses 11a are formed as a recess that continues from the hollow portion of the hollow cavity of the substrate 3, the present invention is not limited to this structure, and the lands to which the chip components are mounted may be formed within a recessed portion provided in the cap seal side surface of the substrate 3 independent of the cavity.

Figure 5:
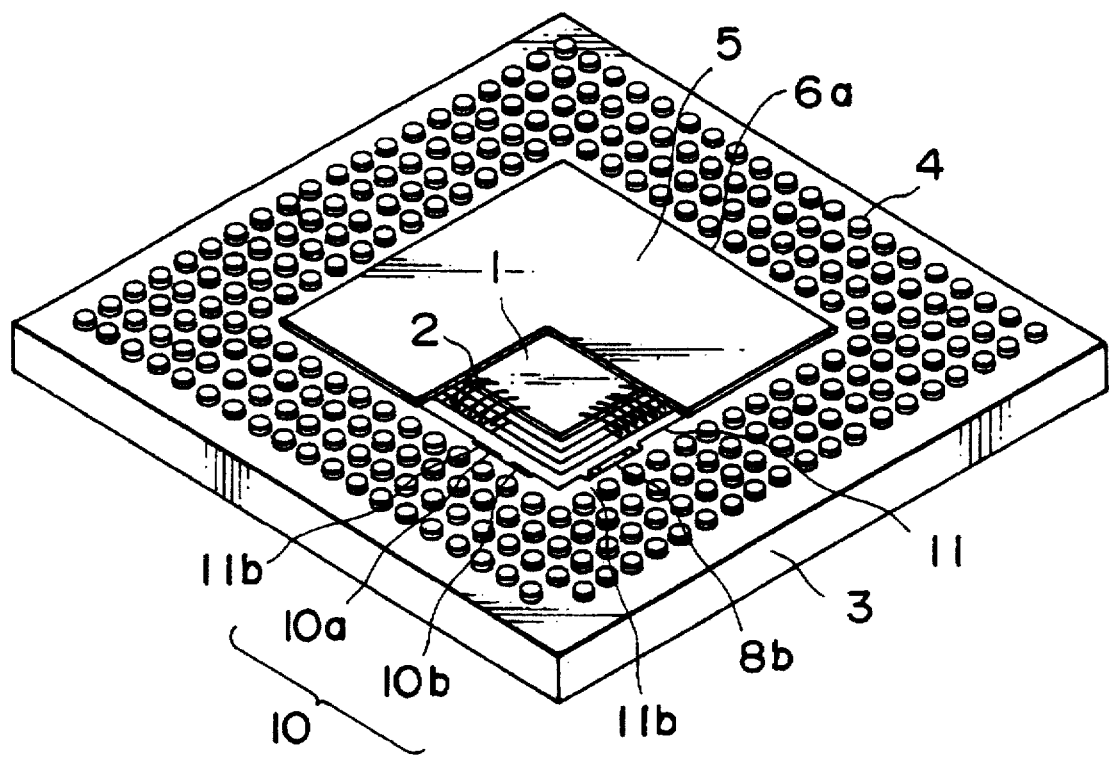
FIG. 5 is a partially sectioned perspective view of a semiconductor device of a third embodiment of the present invention.
Figure 6:
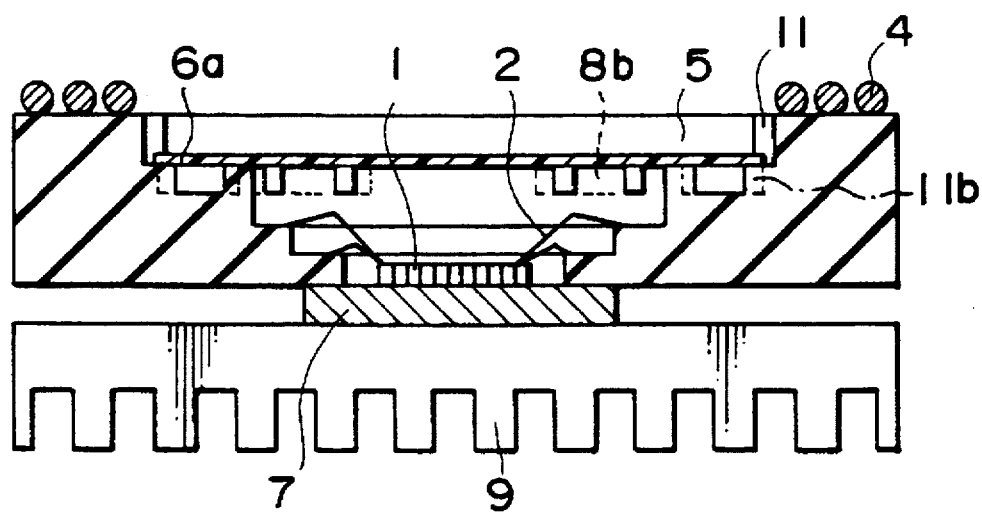
FIG. 6 is a sectional view of the semiconductor device of the third embodiment of the present invention.
Figure 7:
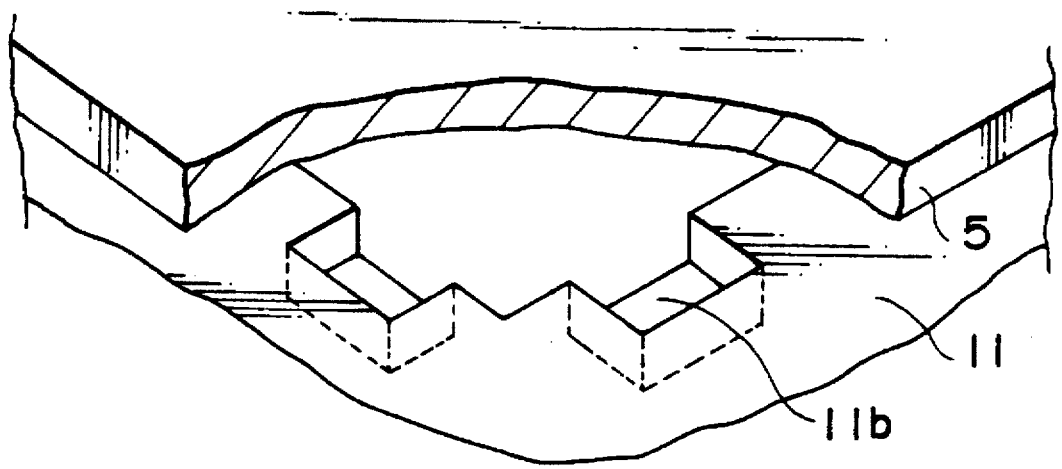
FIG. 7 is a partially sectioned, perspective view for explaining the recess of the third embodiment of the present invention.

FIG. 5 is a partially sectioned, perspective view illustrating a semiconductor device of a third embodiment of the present invention and FIG. 6 is a sectional view of the semiconductor device shown in FIG. 5. In these figures, the reference numeral 1 is a semiconductor chip, 2 are bonding wires made of aluminum or gold, 3 is a multilayer wiring substrate made of FR4 or BT resin or the like, 4 are solder balls made of lead and tin, 5 is a cap made of BT resin or a ceramic, 6a is a cap resin for sealing the cap 5, 7 is a metal plate made of copper or copper alloy, 8b is a large capacitance chip capacitor made of a ceramic, 9 is a heat dissipating fin made of aluminum, copper or the like, 10 are lands made of a conductor such as gold or copper, 11 is a sealing portion in which the multilayer wiring substrate 3 and the cap 5 are covered and 11b are recesses or counter-sinks formed in lower layer surface of the portion opposite to the plane of the cap 5 of the sealing portion 11 of the multilayer wiring substrate 3. That is, as shown in FIG. 7, the recesses 11b are disposed in the sealing portion 11 of the substrate 3 as recessed portions extending to the lower layer of the region to which the cap 5 is mounted within the cavity of the substrate 3.

In this embodiment, the cap 5 covers the entire region for the chip capacitors 8b. The sealing portion 11 to which the chip capacitors 8b are mounted is provided with a plurality of recesses 11b that extend to the lower layer surface of the multilayer wiring substrate 3 where the lands 10, which are extensions of a conductor from the inside of the multilayer wiring substrate 3, are disposed. The lands 10 are formed by extended lead wires of the source layer 10a and the ground layer 10b inside of the multilayer wiring substrate 3.

When the cap 5 is to be sealed to the sealing portion 11 in this embodiment, the chip capacitors 8b are first bonded to the lands 10 by a conductive bonding agent (not shown) and then the cap 5 and the plurality of chip capacitors 8b are covered with the cap resin 6a.

According to this embodiment, as has been described, the sealing portion 11 is provided with the recesses 11b which extend to the lower layer surface of the multilayer wiring substrate 3 and the chip capacitors 8b are mounted within these recesses 11b. Therefore, high speed operation of the chip, higher than an operating frequency of 50 MHz, can be maintained as in the first embodiment, and the outer configuration of the multilayer wiring substrate 3 of the semiconductor package does not become large. Also, since the shape of the cap 5 may be the same as that of the conventional design, the manufacturing cost is not increased.

Further, since the chip capacitors 8b are completely covered by the cap resin 6a, they are protected against falling off the substrate 3 due to an external force or the environment.

Figure 8:
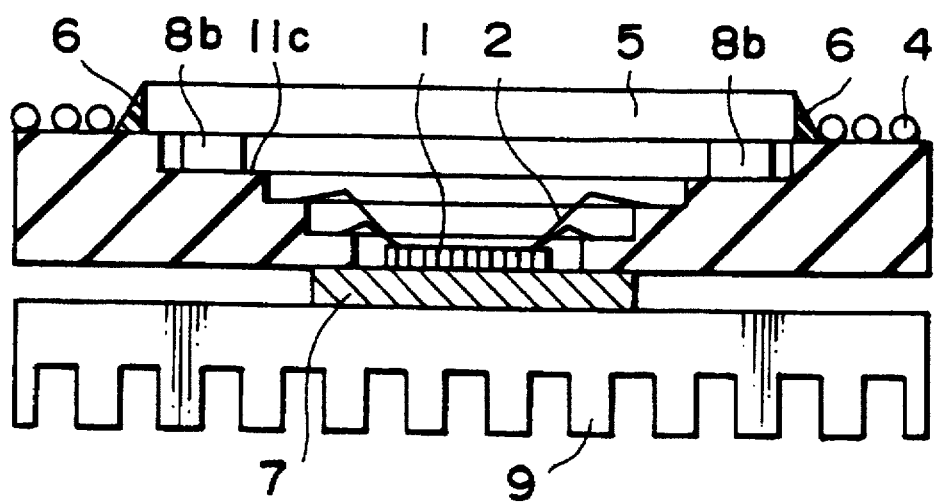
FIG. 8 is a sectional view of a semiconductor device of a fourth embodiment of the present invention.
Figure 9:
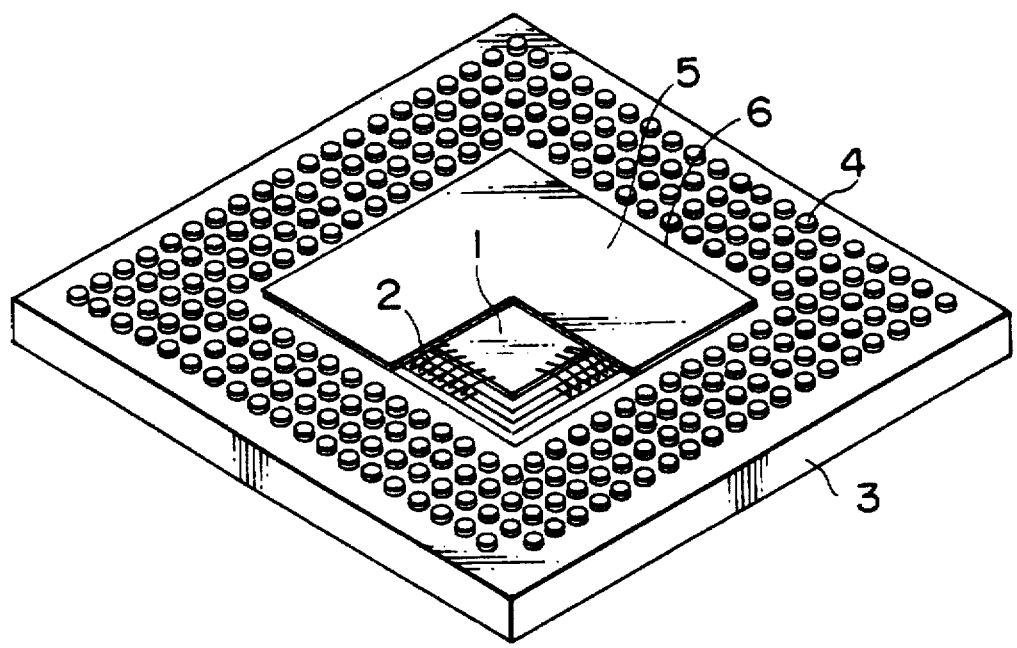
FIG. 9 is a partially sectioned, perspective view of a semiconductor device of a conventional design.
Figure 10:
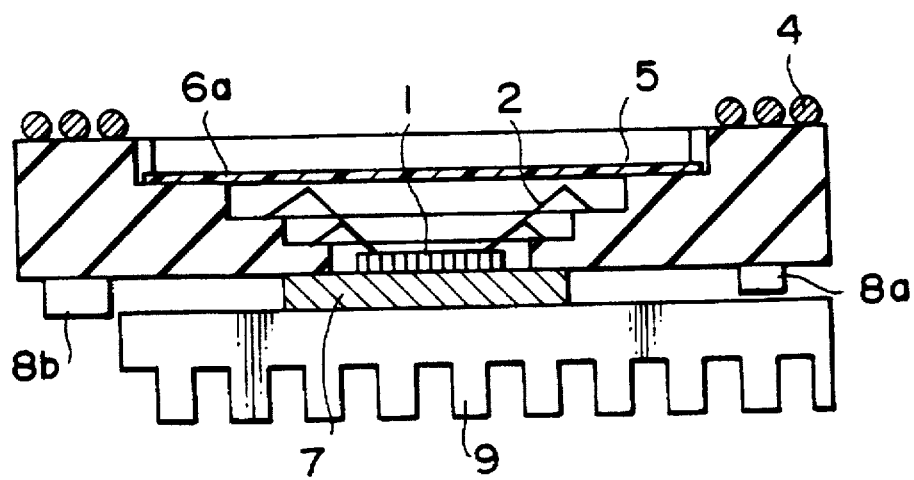
FIG. 10 is a sectional view of the semiconductor device of the conventional semiconductor device.

FIG. 8 illustrates a fourth embodiment of a semiconductor device of the present invention. In FIG. 8, the same reference numerals designate identical or corresponding components to those shown in FIG. 6. In this embodiment, the cap 5 is sealed by the sealing resin 6 on the surface of the multilayer wiring substrate 3 on the cap seal side. Also in this embodiment, the portion opposing the plane of the cap 5 within the cavity of the substrate 3 has formed therein a recessed portion 11c which is an extension of the cavity, and lands (not shown) to which the chip capacitors 8b are mounted are formed within this recessed portion 11c. While the cap 5 is disposed on the surface of the substrate 3 in this embodiment, the substrate 3 may accordingly be made thin. Therefore, also according to this embodiment, the overall thickness of the semiconductor device can be reduced as in the third embodiment.

As has been described, according to the present invention, since the chip components are mounted to the lands formed in the portion opposing to the plane of the notches for the cap of the hollow cavity of the substrate, the cap is not located over the chip components, allowing the semiconductor device to have a reduced overall thickness. Also, since the chip components are mounted on the side of the cap seal of the substrate and does not interfere with the heat dissipating fin disposed on the front side of the substrate, no limitation is imposed upon the size of the heat dissipating fin due to the presence of the chip components. Further, since the chip components are mounted at the level below the front surfaces of the cap and the substrate, they are protected against the external forces, increasing reliability.

Also according to the present invention, since the chip components are mounted within the recesses formed in the portion which does not oppose to the plane of the cap of the substrate, the cap plane does not oppose to the chip components, enabling the overall thickness dimension of the semiconductor device to be small. Also, since the chip components are mounted on the cap seal side of the substrate and do not interfere with the heat dissipating fins disposed on the front side of the substrate, no limitation is imposed upon the size of the heat dissipating fin due to the presence of the chip components. Further, since the chip components are mounted at a level below the front surfaces of the cap and the substrate, they are protected against external forces, increasing reliability.

Also, according to the present invention, since the mounted chip components are sealed by the cap and the sealing resin around the cap, the chip components can be completely protected against falling off the substrate due to external environments such as mechanical forces, significantly improving reliability.

Further, according to the semiconductor device of the present invention, since the chip components are mounted within the recesses formed in the portion opposing to the plane of the cap within the hollow cavity of the substrate, the chip components are not in interfering relationship with respect to the cap in the direction of the plane of the substrate, allowing the overall thickness dimension of the semiconductor device to be small. Also, since the chip components are mounted on the cap seal side of the substrate and do not interfere with the heat dissipating fins disposed on the front side of the substrate, no limitation is imposed upon the size of the heat dissipating fin due to the presence of the chip components. Further, since the chip components are mounted at a level below the front surfaces of the cap and the substrate, they are protected against external forces, increasing reliability.

Further, according to the present invention, since the chip components may be chip capacitors for eliminating the noise, the mounting of the noise-eliminating chip capacitors may not result in the increase of the overall thickness of the semiconductor device as in the conventional design in which they are mounted to the front surface of the substrate. Also, since the chip components are mounted on the cap seal side of the substrate and do not interfere with the heat dissipating fins disposed on the front side of the substrate, no limitation is imposed upon the size of the heat dissipating fin due to the presence of the chip components. Further, since the chip components are mounted at a level below the front surfaces of the cap and the substrate, they are protected against external forces, increasing reliability.

What is claimed is:

1. A semiconductor device comprising:

a substrate having opposed first and second surfaces and a cavity transverse to the first and second surfaces for receiving a semiconductor element, the cavity having a rectangular opening at the first surface, and an internal stepped surface defining the cavity and including multiple steps having surfaces parallel to and transverse to the first and second surfaces;

a semiconductor element mounted within the cavity;

a passive electrical chip component mounted on one of the stepped surfaces parallel to the first and second surfaces;

electrical connecting means disposed in the substrate for electrically connecting the semiconductor element and the passive electrical chip component to an external circuit; and sealing means including a cap attached to the substrate in the rectangular opening, enclosing the semiconductor element within the cavity and the passive electrical chip component within the semiconductor device, the cap including notches at corners of the opening where the cap is not in contact with the substrate, and a resin filling the notches and contacting the substrate and the cap.

2. The semiconductor chip as claimed in claim 1 wherein the stepped surface on which the passive electrical chip component is mounted extends along all of a periphery of the cavity.

3. A semiconductor device as claimed in claim 1 wherein the cap includes projections between the notches, the projections abutting respective walls of the cavity.

4. The semiconductor device as claimed in claim 1 comprising a heat sink attached to the semiconductor element at the second surface of the substrate.

5. The semiconductor device as claimed in claim 1 wherein the resin covers the passive electrical chip component.

6. A semiconductor device comprising:

a substrate having opposed first and second surfaces and a cavity transverse to the first and second surfaces for receiving a semiconductor element, the cavity having a generally rectangular opening at the first surface including outwardly extending portions in the first surface, and an internal stepped surface defining the cavity and including multiple steps having surfaces parallel to and transverse to the first and second surfaces;

a semiconductor element mounted within the cavity;

a passive electrical chip component mounted on one of the stepped surfaces parallel to the first and second surfaces;

electrical connecting means disposed in the substrate for electrically connecting the semiconductor element and the passive electrical chip component to an external circuit; and sealing means including a generally rectangular cap attached to the substrate in the rectangular opening, enclosing the semiconductor element within the cavity and the passive electrical chip component within the semiconductor device, and a resin filling the outwardly extending portions of the opening and contacting the substrate and the cap.

7. The semiconductor device as claimed in claim 6 wherein the resin covers the passive electrical chip component.

8. The semiconductor chip as claimed in claim 6 wherein the stepped surface on which the passive electrical chip component is mounted extends along all of a periphery of the cavity.

9. The semiconductor device as claimed in claim 6 comprising a heat sink attached to the semiconductor element at the second surface of the substrate.

10. A semiconductor device comprising:

a substrate having opposed first and second surfaces and a cavity transverse to the first and second surfaces for receiving a semiconductor element, the cavity having an opening at the first surface, and an internal stepped surface defining the cavity and including multiple steps having stepped surfaces parallel to and transverse to the first and second surfaces, one of the stepped surfaces parallel to the first and second surfaces including a recess;

a semiconductor element mounted within the cavity;

a passive electrical chip component mounted in the recess;

electrical connecting means disposed in the substrate for electrically connecting the semiconductor element within the cavity and the passive electrical chip component in the recess to an external circuit; and sealing means including a cap attached to the first surface of the substrate covering the opening and enclosing the semiconductor element within the cavity and the passive electrical chip component in the recess within the semiconductor device.

11. The semiconductor chip as claimed in claim 10 wherein the stepped surface including the recess extends along all of a periphery of the cavity.

12. The semiconductor device as claimed in claim 10 comprising a heat sink attached to the semiconductor element at the second surface of the substrate.

13. The semiconductor device as claimed in claim 10 wherein the recess includes part of one of the stepped surfaces transverse to the first and second surfaces as a sidewall.

14. The semiconductor device as claimed in claim 10 wherein the recess has an open side and is a continuous extension of the cavity.

* * * * *